United States Patent
Kosinski et al.

(10) Patent No.: US 6,492,884 B1
(45) Date of Patent: Dec. 10, 2002

(54) PROGRAMMABLE TRANSVERSAL FILTER

(75) Inventors: John A. Kosinski, Wall, NJ (US); Robert A. Pastore, Jr., Freehold, NJ (US); Hong-Liang Cui, East Brunswick, NJ (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 09/613,048

(22) Filed: Jun. 29, 2000

Related U.S. Application Data

(63) Continuation-in-part of application No. 09/208,151, filed on Nov. 13, 1998.

(51) Int. Cl.[7] ............................................. H03H 15/00
(52) U.S. Cl. .................... 333/166; 333/193; 310/313 R
(58) Field of Search ............................. 333/152, 166, 333/193, 196, 194, 195, 165, 150; 310/313 R, 313 B

(56) References Cited

U.S. PATENT DOCUMENTS

| | | | | |
|---|---|---|---|---|
| 5,051,709 A | * | 9/1991 | Birkett et al. | 333/28 R |
| 5,225,798 A | * | 7/1993 | Hunsinger et al. | 333/165 |
| 5,387,887 A | * | 2/1995 | Zimmerman et al. | 333/166 |
| 5,394,003 A | * | 2/1995 | Bales et al. | 257/416 |

* cited by examiner

Primary Examiner—Robert Pascal
Assistant Examiner—Dean Takaoka
(74) Attorney, Agent, or Firm—Michael Zelenka; John M. O'Meara

(57) ABSTRACT

The operational flexibility of programmable transversal filters is enhanced by incorporating switch arrays to permit passage for a plurality of tap voltages or signals to particular amplifiers in amplifier arrays. Fixed gain amplifiers may be incorporated to overcome the need to calibrate variable gain amplifiers and to reduced the number of amplifiers required.

4 Claims, 4 Drawing Sheets

PROGRAMMABLE TRANSVERSAL FILTER

GOVERNMENT INTEREST

This is a Continuation-in-part (hereinafter CIP) Application relating to application Ser. No. 09/208,151, filed Nov. 13, 1998 and on which a Notice of Appeal was filed in the PTO on May 8, 2000. Application Ser. No. 09/208,151 is to be abandoned immediately after a Serial No. is assigned to this CIP Application by the PTO. The invention described herein may be manufactured, used, and licensed by or for the United States Government for governmental purposes without payment to us of any royalties thereon.

BACKGROUND OF THE INVENTION

The present invention relates to programmable transversal filters (hereinafter PTF's), particularly those using surface acoustic wave (SAW) substrates as the delay medium along with amplifiers which provide tap weight factors.

Programmable transversal filters using SAW substrates as the delay medium, which include an input interdigitated transducer and a plurality of individual output tap transducers, are well known in the art. Each of (n) tap transducers is paired with and connected to one of (n) variable gain amplifiers forming distinct signal paths for each of (n) tap transducer/amplifier combinations. The outputs of the (n) variable gain amplifiers are connected to the summing junction, which forms the output signal as the sum of the signals from the (n) signal paths. It should be noted that, in general, the signal paths should be connected to the summing junction with alternating polarity between sequential signal paths; such is readily accomplished through the use of both inverting and non-inverting inputs to an operational amplifier used as the summing junction which then provides the output of the filter. Several significant limitations are encountered with these prior art filters. Large numbers of tap transducers are very difficult to achieve thereon because the physical dimensions of the tap transducers on the substrate are not compatible with those of the amplifiers. That is, the width of an individual tap transducer along the SAW propagation direction, is substantially smaller than the width of an individual amplifier, and hence in order to connect each individual tap transducer to its corresponding variable gain amplifier, gross fan-out occurs. Consequently, the SAW device is limited to either a small number of individual tap transducers or the use of tap transducers whose widths are close to those of the variable gain amplifiers. The choice of a limited number of tap transducers results in limited passband bandwidth (passband bandwidth≈1/T) because of the short delay time (T) for the SAW to propagate through the small number of individual tap transducers on the SAW substrate.

The choice of tap transducer widths close to those of the variable gain amplifiers restricts the normal center frequency of the filter, as this frequency is determined jointly by the SAW velocity and periodic spacing of the individual tap transducers. Furthermore, the variable gain of the amplifiers must be calibrated over their full dynamic range if the operational uniformity and repeatability of the filter is to be maintained. This has proven to be impractical, particularly when environmental effects such as temperature changes are encountered. The restrictions on the number and/or spacing of individual transducers seriously limits the filter's operational flexability. Of course, such limitations seriously affect filter quality.

SUMMARY OF THE INVENTION

It is the general object of the present invention to enhance the operational flexibility of programmable transversal filters.

It is the specific object of the present invention to achieve the general object by incorporating switch arrays into otherwise conventional circuitry.

It is a more specific object of the present invention to achieve the general object by incorporating amplifier arrays having fixed gain amplifiers, into the circuitry of the invention.

These and other objects are accomplished in accordance with the present invention, by arranging the switch arrays to permit passage for a plurality of tap voltages or signals to each amplifier.

The scope of the present invention is only limited by the appended claims for which support is predicated on the preferred embodiments hereafter set forth in the following description and the attached drawings.

DESCRIPTION OF THE PREFERRED EMBODIMENTS

Figure 1:
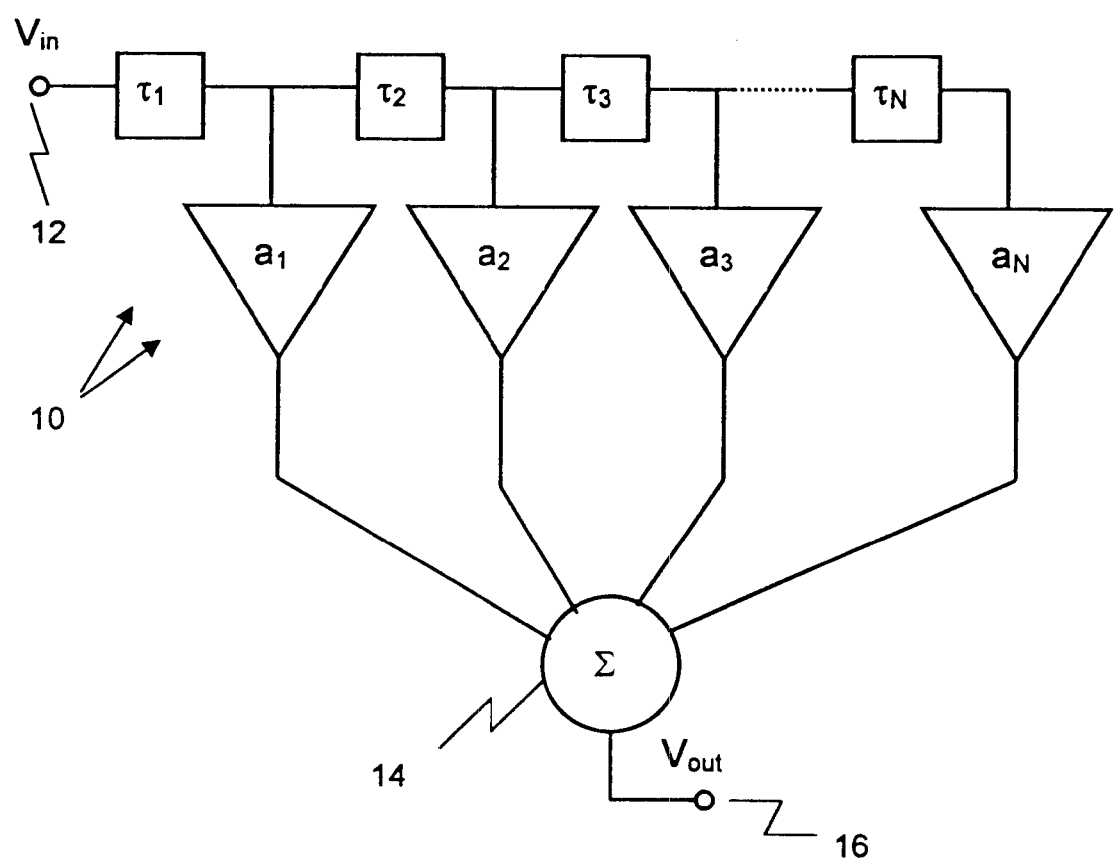
FIG. 1 is the generic schematic/block diagram for a transversal filter.

The generic design of a transversal filter 10 is illustrated in FIG.1 wherein a signal $V_{IN}$ is applied to an input 12 and passes through a sequence of time delays $\tau_1$ through $\tau_N$. Following each time delay, the signal is sampled with each sample being multiplied by a particular weight factor $a_1$, through $a_N$ and passed to a summing junction 14 having an output 16 at which signal $V_{OUT}$ is available.

Figure 2:
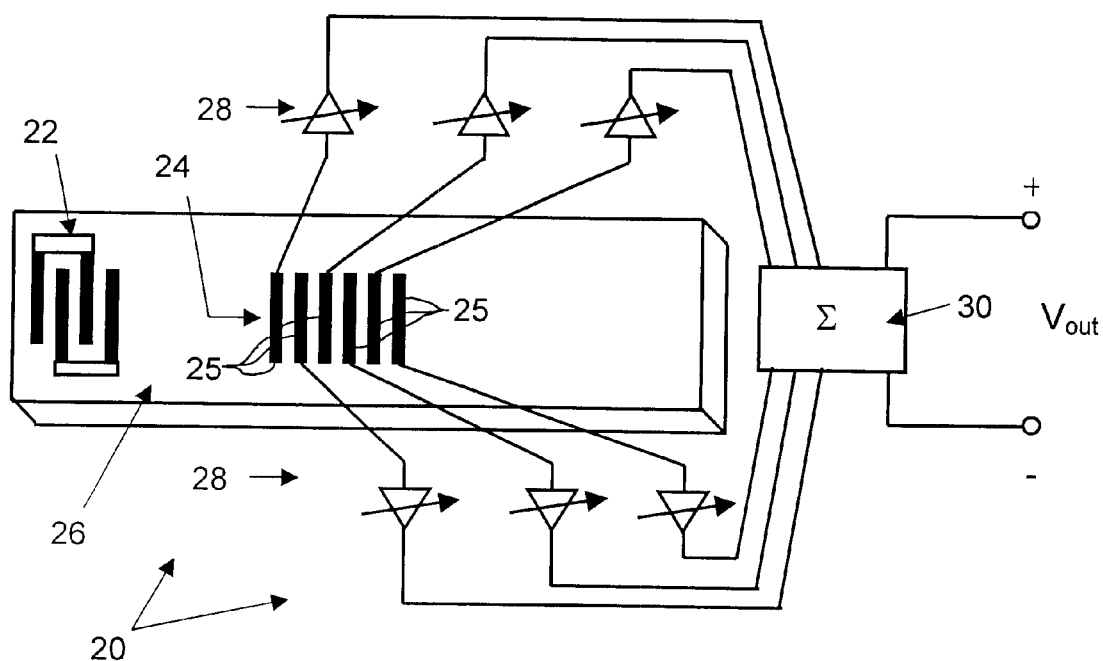
FIG. 2 is the schematic/block diagram for a prior art programmable transversal filter.

A prior art SAW PTF 20 is illustrated in FIG.2 wherein an input interdigitated transducer 22 and an output array 24 having a plurality (M) of individual tap transducers 25, are included on a piezoelectric substrate 26. The output array 24 is connected between a plural (M) of variable gain amplifiers in separate amplifier arrays 28 which each contain M/2 amplifiers. Each individual tap transducer 25 is interconnected through a single corresponding variable gain amplifier to either the inverting or non-inverting input of a summing junction 30 in order to derive the output signal. For the SAW PFT the individual tap transducers are generally connected to the summing junction with alternating polarities from one individual tap transducer to the next. As is well known to those skilled in the art, the gain of each variable gain amplifier must be adjusted to provide the desired tap weight factors when determining the operational transfer function of the filter 20. If the operational uniformity and repeatability of the tap weight factors are to be maintained however, the variable gain of each amplifier must be calibrated over the full dynamic range thereof, and maintain that calibration over environmental variations which has proven to be impractical.

Figure 3:
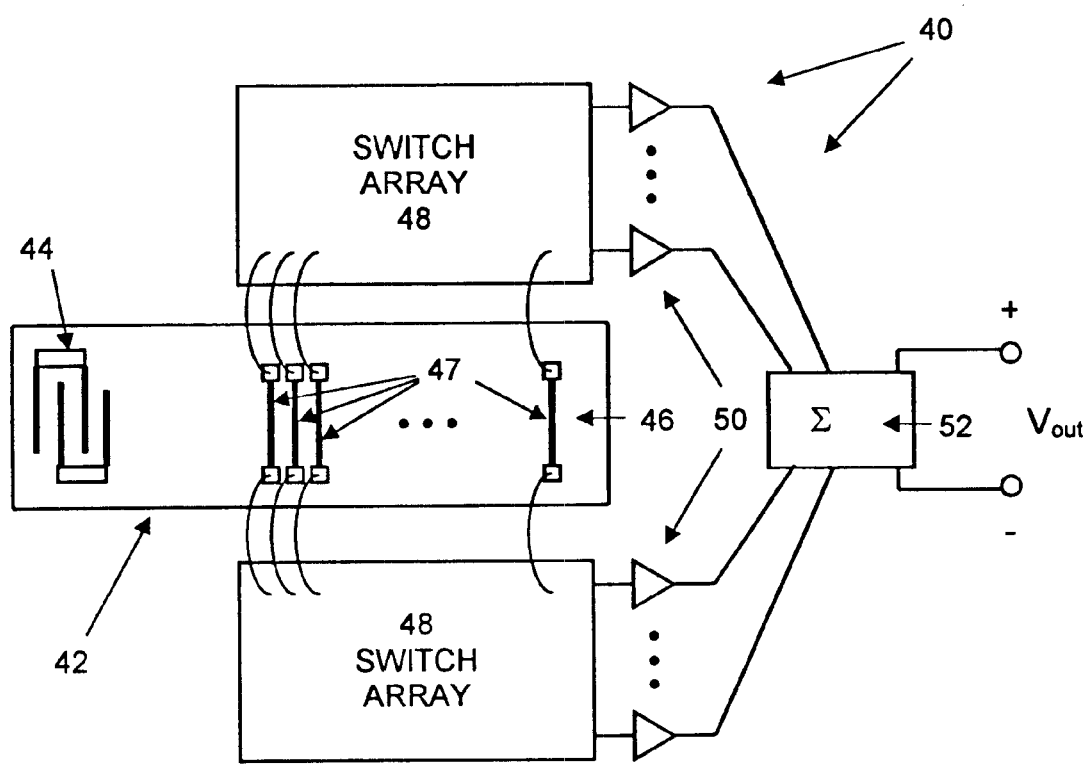
FIG. 3 is the schematic/block diagram for the programmable transversal filter of the present invention.

Such prior art difficulties are overcome with the programmable transversal filter 40 of the invention. As illustrated in FIG. 3, transversal filter 40 also includes a piezoelectric substrate 42 having an input interdigitated transducer 44 and an output array 46 with a plurality (M) of individual tap transducers 47. The output array 46 is connected between a pair of switch arrays 48 which are each connected through separate amplifier arrays 50, to a summing junction 52 in order to derive the output signal. Amplifier arrays 50 could include either variable and/or fixed gain amplifiers. Depending on the desired filter quality and bandwidth of the passband, each tap transducer 47 is connected to one switch in either or neither or both switch arrays 48. The amplifier arrays 50 each contain a total number (N) of amplifiers and the switch arrays 48 connect each of the (M) tap transducers 47 to one of the amplifiers. Each of the (N) amplifiers may be connected simultaneously to any number 0<x<M of the individual tap transducers. (M)×(N) cross bar switch means which are well known to those skilled in the switching arts, could be utilized as the switch arrays 48. Other types of switch arrays may be utilized however, it should be noted that repeatable, low contact resistance, and stable path lengths are desired. Furthermore, the switch array should be dimensionally compatible with the periodic spacing of the individual tap transducers and the the variable gain amplifiers in the amplifier array. As such, a preferred embodiment would be a micro-electro-mechanical (MEM) switch array.

Figure 4:
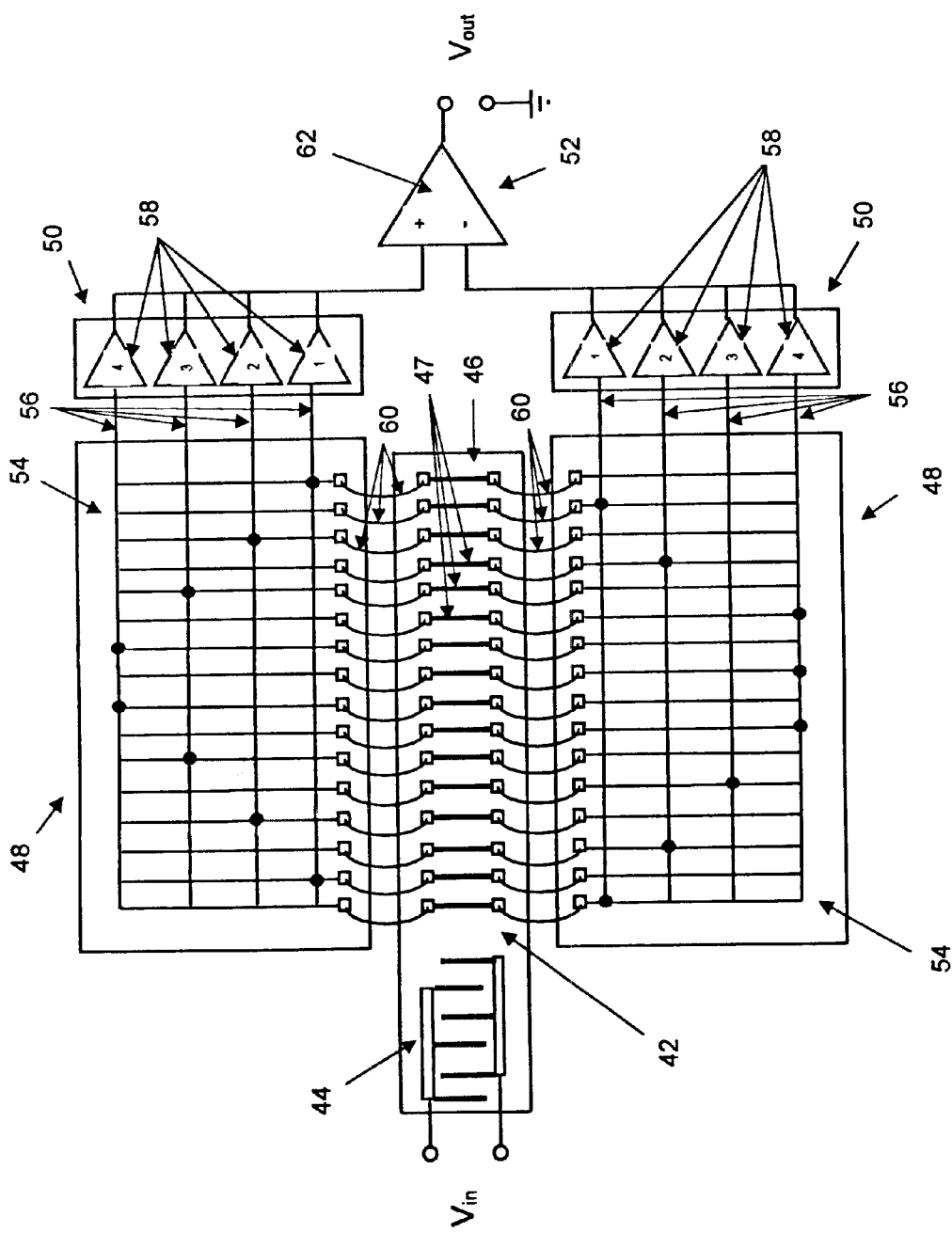
FIG. 4 is the schematic/block diagram for an embodiment which illustrates the principle of operation for the present invention.

The operation of the invention is illustrated by FIG. 4 wherein a cross bar switch 54 is incorporated to serve as each switch array 48. Each cross bar switch 54 includes conductors 56 that individually connect to a particular amplifier in one of the amplifier arrays 50, as well as interconnects 60 which interface the conductors 56 with the individual tap transducers 47. Each interconnect 60 in the cross bar switches 54, may be interfaced with any one of the conductors 56 as shown in FIG. 4, where such interfaces are shown as shaded circles. Therefore, each conductor 56 can connect a plurality of the individual tap transducers 47 to a single amplifier 58 and thereby alleviate the previously mentioned fan-out problem. Outputs from the amplifiers 58 pass to an operational amplifier 62 which serves as the summing junction 52, with those in one amplifier array 50 passing to the non-inverting input thereof and those in the other amplifier array 50 passing to the inverting input thereof. In accordance with prior art, the signal configuration to be generated is accomplished by indexing the amplifiers in each array 50, with a particular sequence of gains.

As is well known in the art, a SAW transversal filter will only pass the frequencies within its passband, and these frequencies are generally determined by the periodic spacing of the tap transducers and the total delay time through the longest transducer or array. In the prior art however, the tap transducers interconnect directly to the amplifiers as shown in FIGS. 1 and 2, which limits the possible passband frequencies, as discussed previously in the Background Of The Invention. This is so because the spacing between the tap transducers is substantially smaller than the attainable spacing between the amplifiers. Furthermore, variable gain amplifiers must be utilized in the prior art, if the capability to process a variety of signals is desired.

By incorporating the switch arrays 48, the invention to which the Application relates provides the necessary compatibility between tap transducer spacing and amplifier spacing for overcoming the limitation regarding the passband center frequency and bandwidth. Although either variable and/or fixed gain amplifiers could be incorporated in the invention, only fixed gain amplifiers 58 are utilized in the preferred embodiment of FIG. 4, and these amplifiers 58 are numbered 1 through 4 in each of the amplifier arrays 50. By incorporating the fixed gain amplifiers 58, the need to calibrate variable gain amplifiers is overcome and the number of amplifiers required is reduced. The gain sequence of amplifiers 1 through 4 in each amplifier array 50 will be determined in accordance with the voltage or signal to be generated and prior art techniques for such generation.

Those skilled in the art will appreciate without any further explanation that within the concept of this invention many modifications and variations are possible to the above disclosed embodiments of the PTF and implementing circuitry therefor. In particular, the possibility to invert the topology and implement an array of individual tap transducers as the input transducer and an output interdigitated transducer is explicitly envisioned. Consequently, it should be understood that all such variations and modifications fall within the scope of the following claims.

What we claim is:

1. In a programmable transversal filter of the type wherein a piezoelectric substrate having an input. interdigitated transducer and an output array having a plurality of individual tap transducers which are connected to a summing junction through arrays of amplifiers, the improvement comprising:

each amplifier has a fixed gain; and switch arrays interconnect the individual tap transducers to the amplifier arrays wherein the amplifiers are indexed with a particular sequence of gains, in accordance with the desired filter transfer function.

2. In a programmable transversal filter having a piezoelectric substrate that includes an input transducer and an output array having a plurality of individual tap transducers, the improvement comprising:

the output array is connected between a pair of switch arrays with each individual tap transducer thereof being connected to one of the switches in at least one of the switch arrays; and each switch array is connected to a summing junction through separate arrays of fixed gain amplifiers, with conductive paths being established thereby between each individual tap transducer and at least one fixed gain amplifier that are selected to obtain the desired weighting factor for that tap transducer.

3. In a programmable transversal filter of the type wherein a piezoelectric substrate having an input transducer and an output array having a plurality of individual tap transducers that are connected to a summing junction through arrays of amplifiers, the improvement comprising:

cross bar switches having conductors and interconnects disposed in a grid pattern with the conductors individually connected to a particular amplifier in only one array and the interconnects individually connected to a particular individual tap transducer, while the gains of the amplifiers in each array are sequenced to index the inputs at the summing junction in accordance with the desired filter transfer function.

4. The programmable transversal filter of claim 3 wherein only fixed gain amplifiers are utilized to overcome the need for calibrating variable gain amplifiers and to reduce the number of amplifiers required.

* * * * *